(12) United States Patent
Hisano et al.

(10) Patent No.: US 11,268,912 B2
(45) Date of Patent: Mar. 8, 2022

(54) SUBSTRATE INSPECTION METHOD AND SUBSTRATE INSPECTION APPARATUS

(71) Applicant: TOKYO ELECTRON LIMITED, Tokyo (JP)

(72) Inventors: Kazuya Hisano, Koshi (JP); Akiko Kiyotomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/514,995

(22) Filed: Jul. 17, 2019

(65) Prior Publication Data
US 2020/0025692 A1 Jan. 23, 2020

(30) Foreign Application Priority Data

Jul. 19, 2018 (JP) .............................. JP2018-135791

(51) Int. Cl.
*G01N 21/95* (2006.01)
*H01L 21/66* (2006.01)
*H01L 21/67* (2006.01)

(52) U.S. Cl.
CPC ... *G01N 21/9503* (2013.01); *H01L 21/67242* (2013.01); *H01L 22/12* (2013.01)

(58) Field of Classification Search
CPC ............... H01L 21/67242; H01L 22/12; H01L 21/6715; H01L 21/67288; H01L 22/20; H01L 22/24; H01L 22/30; G01N 21/9503; G01N 2021/8887; G01N 21/8851; G01N 21/9501
See application file for complete search history.

(56) References Cited

U.S. PATENT DOCUMENTS

| 7,477,370 B2* | 1/2009 | Michelsson ........ G01N 21/8803 355/77 |
| 7,656,519 B2* | 2/2010 | Meeks ................. G01B 11/065 356/237.2 |
| 9,064,922 B2* | 6/2015 | Nakajima ............. H01L 21/681 |
| 9,645,097 B2* | 5/2017 | Nicolaides ......... G01N 21/9503 |
| 2005/0023491 A1* | 2/2005 | Young ................ G01N 21/9503 250/559.42 |
| 2008/0013822 A1* | 1/2008 | Pai ...................... G01N 21/9501 382/145 |
| 2011/0115903 A1* | 5/2011 | Shalem .............. G01N 21/8851 348/135 |
| 2012/0086796 A1* | 4/2012 | Lewis ................. G01N 21/956 348/87 |

(Continued)

FOREIGN PATENT DOCUMENTS

JP 2017-152443 A 8/2017

*Primary Examiner* — Deoram Persaud
(74) *Attorney, Agent, or Firm* — Nath, Goldberg & Meyer; Jerald L. Meyer

(57) ABSTRACT

A substrate inspection method includes: acquiring a feature amount of each of divided areas in an inspection target peripheral edge image, the inspection target peripheral edge image being an image of a peripheral portion of a target substrate as an inspection target, the divided areas being obtained by dividing a predetermined area in the image of the peripheral portion of the target substrate into a plurality of areas; and performing a predetermined determination concerning inspection of the peripheral portion of the target substrate based on an acquisition result in the acquiring the feature amount.

6 Claims, 12 Drawing Sheets

(56) References Cited

U.S. PATENT DOCUMENTS

| | | | | |
|---|---|---|---|---|
| 2014/0253910 A1* | 9/2014 | Lewis | ................ | G01N 21/9515 |
| | | | | 356/237.5 |
| 2015/0192529 A1* | 7/2015 | Sato | ....................... | G01N 21/88 |
| | | | | 438/16 |
| 2017/0132772 A1* | 5/2017 | Ogawa | .................. | G02B 27/283 |
| 2017/0244936 A1* | 8/2017 | Koga | ..................... | H04N 7/183 |

* cited by examiner

SUBSTRATE INSPECTION METHOD AND SUBSTRATE INSPECTION APPARATUS

CROSS-REFERENCE TO RELATED APPLICATION

This application is based upon and claims the benefit of priority from Japanese Patent Application No. 2018-135791, filed on Jul. 19, 2018, the entire contents of which are incorporated herein by reference.

TECHNICAL FIELD

The present disclosure relates to a substrate inspection method and a substrate inspection apparatus.

BACKGROUND

Patent Document 1 discloses an inspection unit that inspects respective surfaces (a front surface, a rear surface, and an end surface) in the peripheral edge of a substrate. The inspection unit includes a holding table configured to hold and rotate a substrate, and further includes a mirror member and a camera as follows. The mirror member has a reflection surface, which is inclined with respect to the rotation axis of the holding table and faces the peripheral area of the rear surface and the end surface of the substrate held by the holding table. In addition, the camera includes an imaging element to which light from the peripheral area of the front surface of the substrate held by the holding plate is input through a lens together with the reflected light obtained when the light from the end surface of the substrate held on the holding table is reflected from the reflection surface of the mirror member.

PRIOR ART DOCUMENTS

Patent Documents
Patent Document 1: Japanese laid-open patent publication No. 2017-152443

SUMMARY

A substrate inspection method includes: acquiring a feature amount of each of divided areas in an inspection target peripheral edge image, the inspection target peripheral edge image being an image of a peripheral portion of a target substrate as an inspection target, the divided areas being obtained by dividing a predetermined area in the image of the peripheral portion of the target substrate into a plurality of areas; and performing a predetermined determination concerning inspection of the peripheral portion of the target substrate based on an acquisition result in the acquiring the feature amount.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
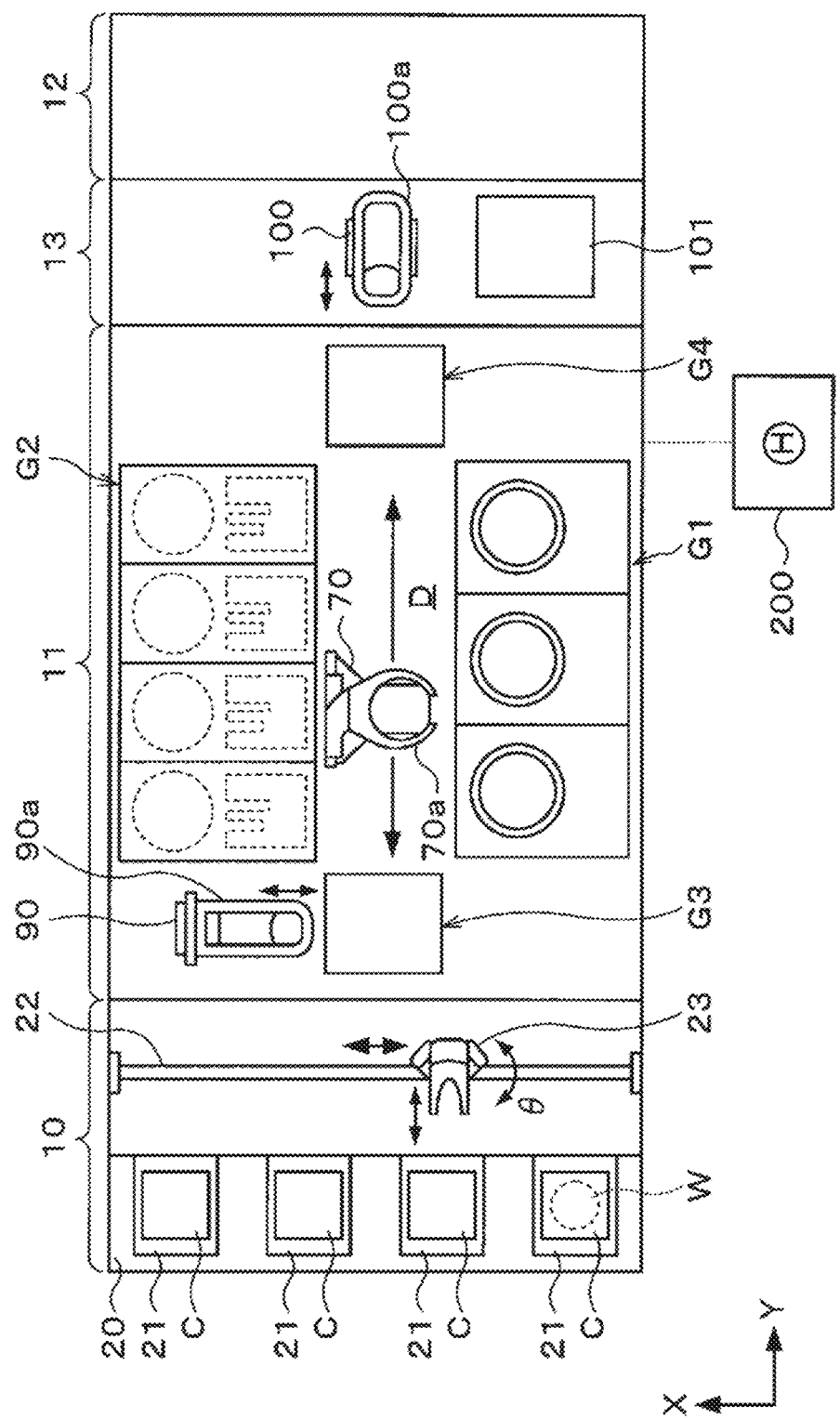
FIG. 1 is a plan view schematically illustrating the outline of a configuration of a substrate processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a conventional substrate inspection apparatus described in Patent Document 1 will be described.

In a semiconductor device manufacturing process, various processes such as an ion implantation process, a film forming process, a photolithograph), process, an etching process, and the like are performed on a semiconductor wafer as a substrate (hereinafter, referred to as "wafer"). In the photolithography process of forming a predetermined resist pattern on a wafer, a process of applying a resist liquid on the wafer so as to form a resist film, a process of developing the resist film exposed to a predetermined pattern, and the like are sequentially performed.

The peripheral portion of a wafer on which various processes related to the above-described semiconductor device manufacturing process are performed is thinner than the center of the wafer due to a wafer polishing process. For this reason, the peripheral edge area of the front surface of the wafer is inclined relative to the central area of the front surface of the wafer. In addition, due to the above-mentioned inclination and variation in process conditions in various processes related to the above-mentioned manufacturing process, it is difficult to control a state of the peripheral portion of the wafer. Monitoring the state of the peripheral portion of the wafer and detecting an abnormality contributes not only to increase in the number of effective chips, but also to improvement in yield of chips in the vicinity of the peripheral portion.

Therefore, in order to inspect the peripheral edge of a wafer, the inspection unit of Patent Document 1 includes a camera including an imaging element into which light from the peripheral edge area of the front surface of the wafer and reflected light obtained when light from the lateral end surface of the wafer is reflected by the reflection surface of the mirror member are input. In other words, the inspection unit of Patent Document 1 images the peripheral portion of the wafer and inspects the peripheral portion of the wafer based on the imaging result.

Examples of a method of inspecting the state of the peripheral portion of a wafer using a captured peripheral edge image based on the imaging result of the peripheral portion of the wafer as described above include the following. A surrounding comparison method is a method of detecting an abnormality from a difference between an image of an inspection objection area in a captured image and an image of an area in the vicinity of the inspection objection area in the captured image area. There is also a method of acquiring the position of the edge of a film formed on a wafer from light and dark in a captured image (an edge trace method). In this method, for example, when forming an annular film along the peripheral portion of a wafer, the position of the inner edge of the annular film is obtained. Then, the distance from the edge of the wafer to the inner edge of the annular film may be calculated, and the acceptance or rejection of film formation may be determined based on the calculation result.

However, it is hard to detect a macroscopic abnormality through any of the methods described above. The macroscopic abnormality means, for example, a state as illustrated in FIG. 11C to be described later when a resist film is formed annularly on a wafer along the peripheral portion of the wafer. In FIG. 11C, although the edge of a resist film R opposite the peripheral end surface of the wafer W is clear, it is impossible to form the resist film R on the peripheral end surface of the wafer W. When there is an abnormality as illustrated in FIG. 11C, in the surrounding comparison method described above, it is determined that a circular film is formed in the central portion, and in the edge trace method described above, it is determined that there is no abnormality since it is possible to obtain the edge of the resist film.

In the inspection concerning the peripheral portion of a wafer, an abnormality determination is not performed by registering a substrate image (golden image) as a reference and perform pattern matching based on the golden image. This is because matching between the patterns is poor at the peripheral portion of the wafer and it is difficult to perform accurate abnormality determination even if images are compared.

Hereinafter, a substrate processing method and a substrate inspection apparatus according to the present embodiment, which enable detection of a macroscopic abnormality in the peripheral portion of a substrate when inspecting the substrate, will be described with reference to the drawings In this specification and the accompanying drawings, elements having substantially the same functional configurations will be denoted by the same reference numerals and redundant explanations will be omitted.

Figure 2:
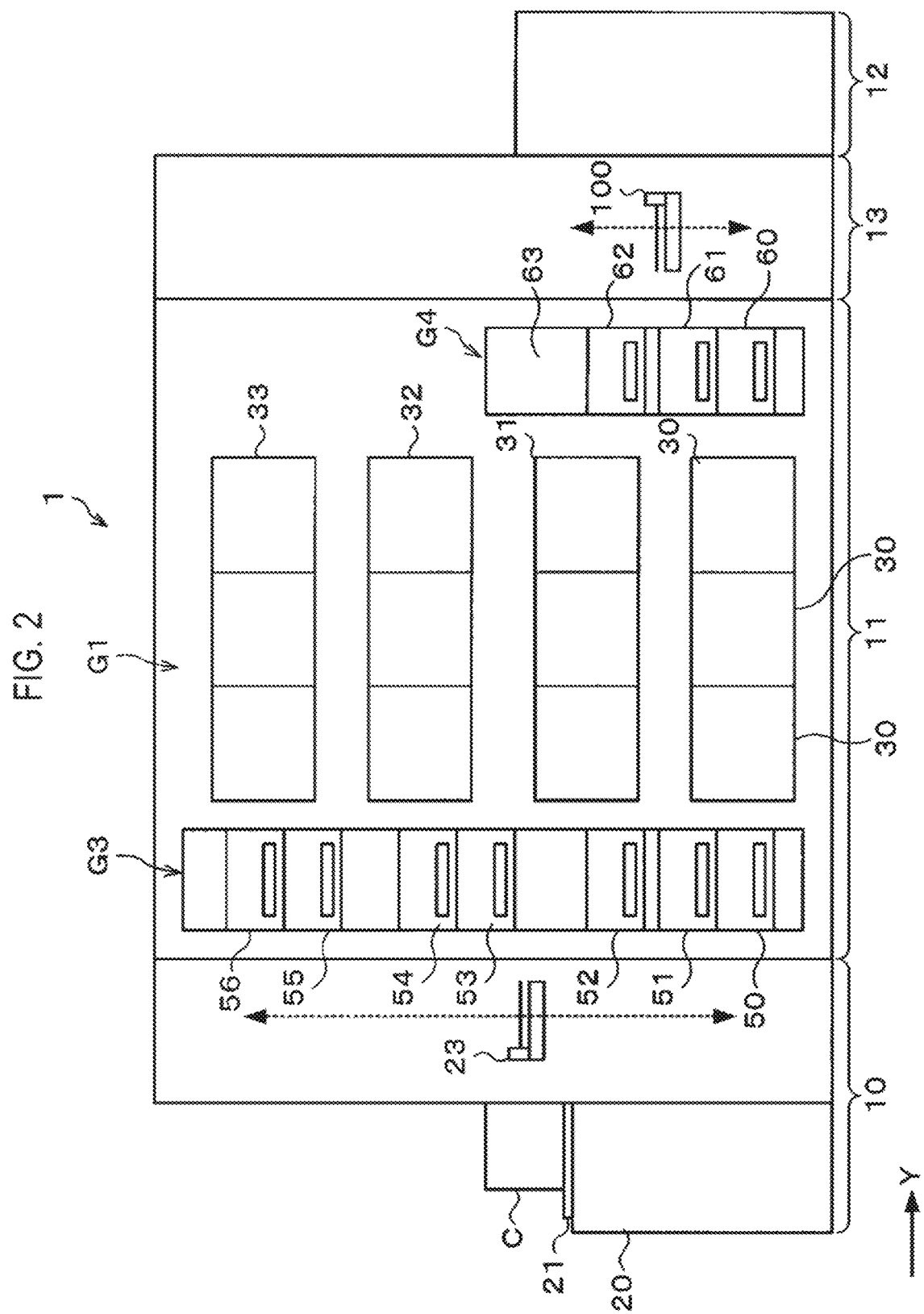
FIG. 2 is a side view illustrating the outline of an internal configuration of the substrate processing system according to the embodiment.
Figure 3:
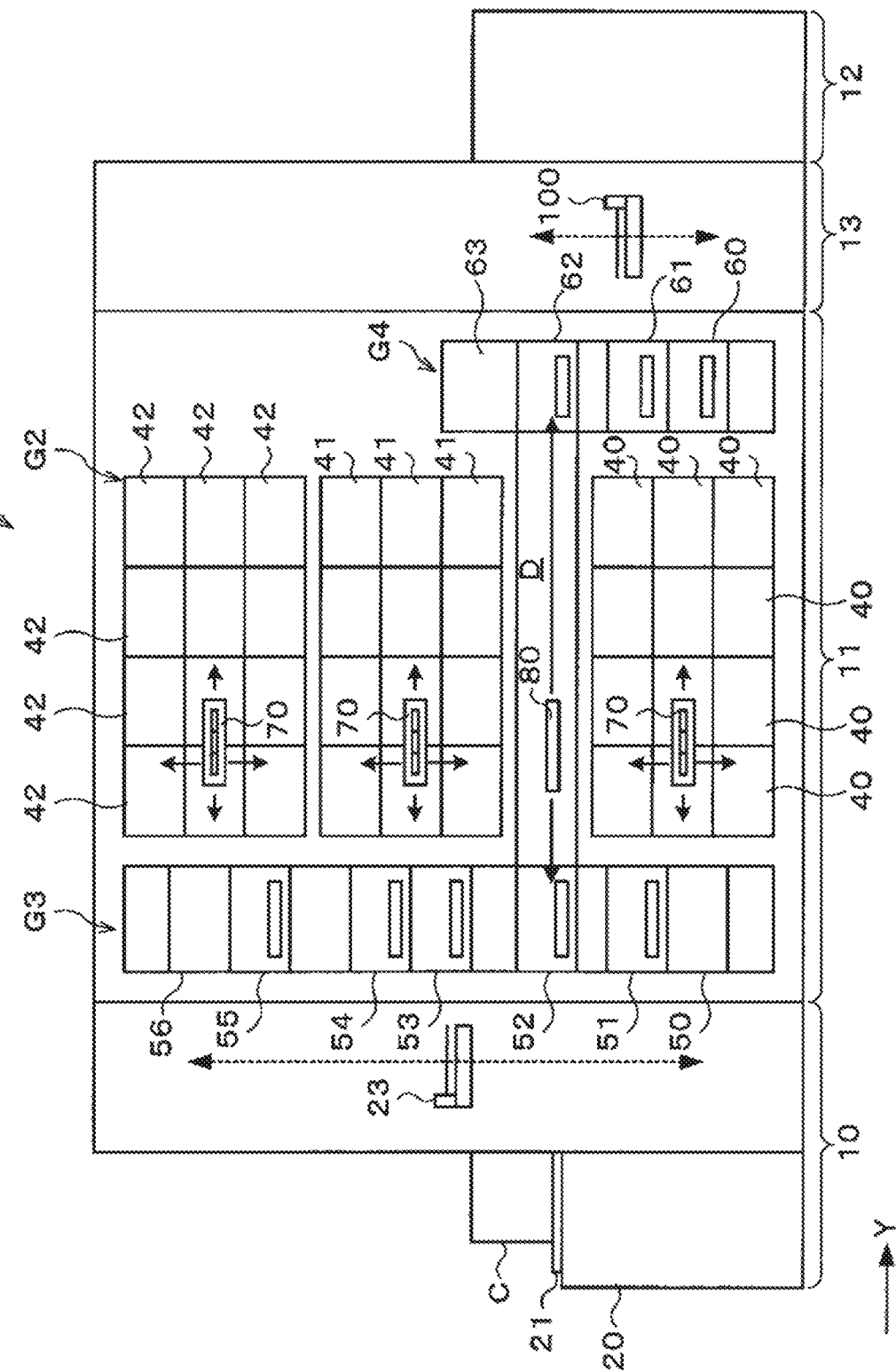
FIG. 3 is a side view illustrating the outline of an internal configuration of the substrate processing system according to the embodiment.

FIG. 1 is a plan view illustrating the outline of the configuration of a substrate processing system 1 provided with a substrate inspection apparatus according to the present embodiment. FIGS. 2 and 3 are a front view and a rear view, each of which schematically illustrates the outline of the internal configuration of the substrate processing system 1. In the present embodiment, the case in which the substrate processing system 1 is a coating and developing system for performing coating and developing processes on a wafer W will be described as an example.

As illustrated in FIG. 1, the substrate processing system 1 includes a cassette station 10 configured such that a cassette C accommodating a plurality of wafers W is loaded in/unloaded from the cassette station 10, and a processing station 11 including a plurality of various processing apparatuses, each of which is configured to perform a predetermined process on the wafers W. In addition, the substrate processing system 1 has a configuration in which the cassette station 10, the processing station 11, and an interface station 13 configured to deliver a wafer W between the processing station 11 and the exposure apparatus 12 adjacent to the processing station 1 are integrally connected.

The cassette station 10 is provided with a cassette stage 20. The cassette stage 20 is provided with a plurality of cassette placement plates 21, each of which is configured to place a cassette C on the cassette placement plate 21 when the cassette C is loaded into the substrate processing system 1 from the outside or unloaded from the substrate processing system 1 to the outside.

The cassette station 10 is provided with a wafer transfer apparatus 23 which is movable on a transfer path 22 extending in the X direction. The wafer transfer apparatus 23 is also movable in the vertical direction and around the vertical axis (0 direction), and is capable of transferring a wafer W between the cassette C on each cassette placement plate 21 and a delivery apparatus of a third block G3 of the processing station 11 described later.

The processing station 11 is provided with a plurality of, for example, four, blocks G1, G2, G3, and G4, each of which includes various apparatuses. For example, the first block G1 is provided on the front side (on the negative direction side in the X direction in FIG. 1) of the processing station 11, and the second block G2 is provided on the rear side (on the positive direction side in the X direction in FIG. 1) of the processing station 11. In addition, the third block G3 is provided on the cassette station side (on the negative direction side in the Y direction in FIG. 1) of the processing station 11, and the fourth block G4 is provided on the interface station 13 side (on the positive direction side in the Y direction in FIG. 1) of the processing station 11.

As illustrated in FIG. 2, in the first block G1, a plurality of liquid processing apparatuses, for example, developing apparatuses 30, lower antireflective film forming apparatuses 31, resist coating apparatuses 32, and upper antireflective film forming apparatuses 33 are disposed in order from the bottom. The developing apparatus 30 performs a developing process on a wafer W, and the lower antireflective film forming apparatus 31 forms an under-laying antireflective film (hereinafter referred to as "lower antireflective film") of a resist film of the wafer W. The resist coating apparatus 32 forms the resist film by applying a resist liquid to the wafer W, and the upper antireflective film forming apparatus 33 forms an upper-laying antireflective film (hereinafter referred to as "upper antireflective film") of the resist film of the wafer W.

For example, three developing apparatuses 30, three lower antireflective film forming apparatuses 31, three resist coating apparatuses 32, and three upper antireflective film forming apparatuses 33 are arranged along the horizontal direction. In addition, the numbers and arrangements of the developing apparatuses 30, the lower antireflective film forming apparatuses 31, the resist coating apparatuses 32, and the upper antireflective film forming apparatuses 33 may be arbitrarily selected.

In the developing apparatuses 30, the lower antireflective film forming apparatuses 31, the resist coating apparatuses 32, and the upper antireflective film forming apparatuses 33, for example, spin coating is performed to apply a predetermined coating liquid on the wafer W. In the spin coating, for example, the coating liquid is ejected from a coating nozzle to the wafer W while rotating the wafer W so as to diffuse the coating liquid on the front surface of the wafer W.

As illustrated in FIG. 3, the second block G2 includes heat treatment apparatuses 40 configured to perform heat treatment such as heating or cooling of the wafer W, adhesion apparatuses 41 configured to enhance fixability between the resist liquid and the wafer W. and periphery exposure apparatuses 42 configured to perform a exposing process on the outer periphery of the wafer W. The heat treatment apparatuses 40, the adhesion apparatuses 41, and the periphery exposure apparatuses 42 are arranged side by side in the vertical direction and in the horizontal direction. The numbers and arrangements of the heat treatment apparatuses 40, the adhesion apparatuses 41, and the periphery exposure apparatuses 42 may be arbitrarily selected.

For example, in the third block G3, a plurality of delivery apparatuses 50, 51, 52, 53, 54, 55, and 56 are provided in order from the bottom. In addition, in the fourth block G4, a plurality of delivery apparatuses 60, 61, and 62 and an inspection apparatus 63 serving as a substrate inspection apparatus are provided in order from the bottom. Configuration of the inspection apparatus 63 will be described later.

As illustrated in FIG. 1, a wafer transfer area D is defined in an area surrounded by the first to fourth blocks G1 to G4. In the wafer transfer area D, a wafer transfer apparatus 70 is disposed.

The wafer transfer apparatus 70 has a transfer arm 70a which is movable, for example, in the Y direction, the X direction, the θ direction, and the vertical direction. The wafer transfer apparatus 70 moves in the wafer transfer area D, and transfers a wafer W to a desired unit to the surrounding first block G1, the second block G2, the third block G3, and the fourth block G4. For example, as illustrated in FIG. 3, a plurality of wafer transfer apparatuses 70 are vertically arranged, and each of the wafer transfer apparatuses 70 is configured to transfer the wafer W to desired units, which are arranged at substantially the same heights to that of the corresponding wafer transfer apparatus 70, in the blocks G1 to G4.

In addition, in the wafer transfer area D, a shuttle transfer apparatus 80 configured to transfer the wafer W linearly between the third block G3 and the fourth block G4 is provided.

The shuttle transfer apparatus 80 is configured to be linearly movable, for example, in the Y direction in FIG. 3. The shuttle transfer apparatus 80 can move in the Y direction in the state where a wafer W is supported by the shuttle transfer apparatus 80, so that the wafer W can be transferred between the delivery apparatus 52 of the third block G3 and the delivery apparatus 62 of the fourth block G4.

As illustrated in FIG. 1, a wafer transfer apparatus 90 is provided next to the third block G3 on the positive direction side in the X direction. The wafer transfer apparatus 90 has a transfer arm 90a, which is movable, for example, in the X direction, the θ direction, and the vertical direction. The wafer transfer apparatus 90 can moving upward and downward in the state where a wafer W is supported by the wafer transfer apparatus 90, so that the wafer W can be transferred to the respective delivery apparatuses in the third block G3.

The interface station 13 is provided with a wafer transfer apparatus 100 and a delivery apparatus 101. The wafer transfer apparatus 100 has a transfer arm 100a, which is movable, for example, in the Y direction, the θ direction, and the vertical direction. The wafer transfer apparatus 100 is configured to transfer a wafer W among the delivery apparatuses in the fourth block G4, the delivery apparatus 101, and the exposure apparatus 12, while the wafer W is supported, for example, on the transfer arm 100a.

Figure 4:
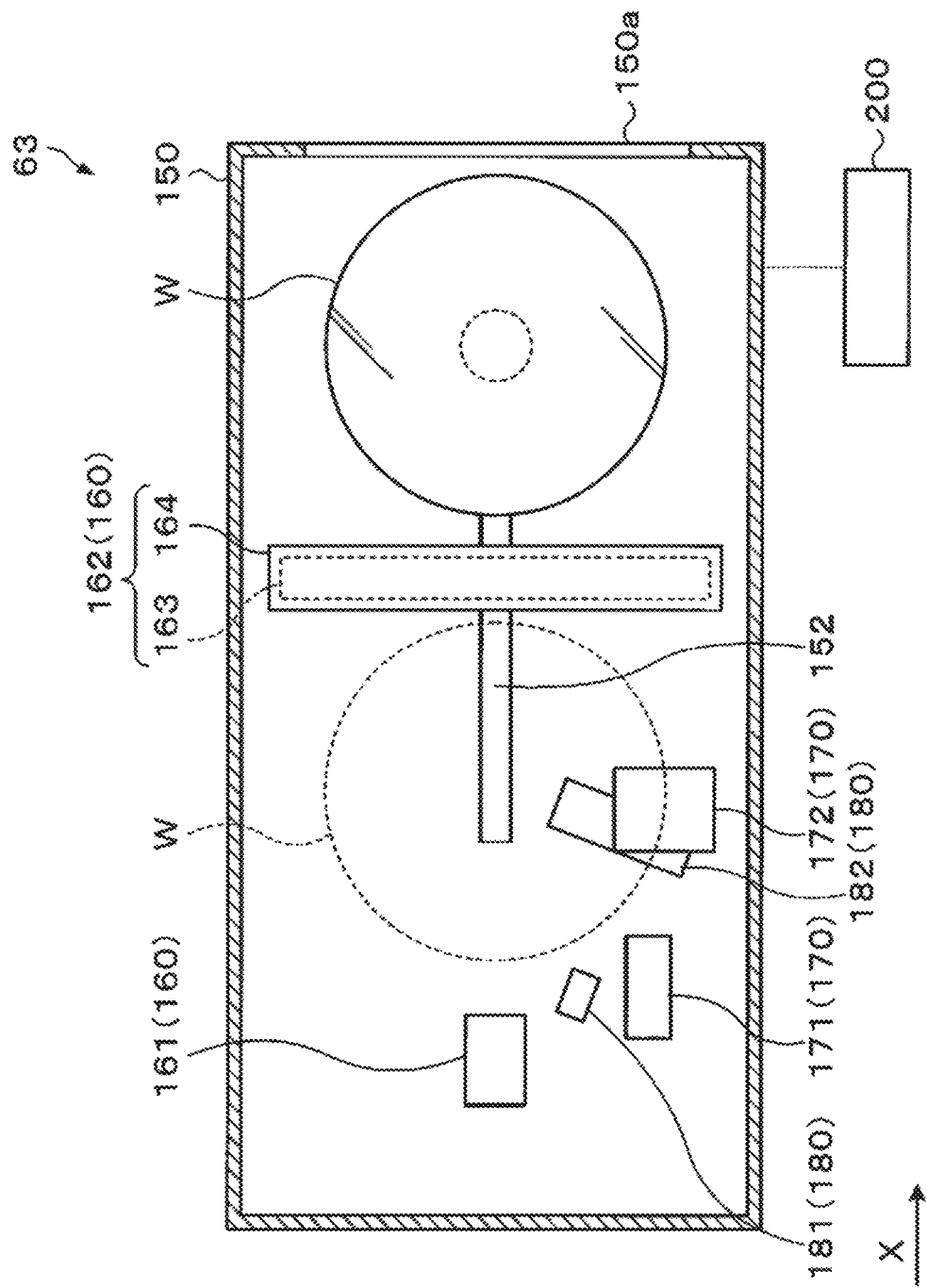
FIG. 4 is a cross-sectional view illustrating the outline of a configuration of an inspection apparatus.

Next, the configuration of the inspection apparatus 63 described above will be described. As illustrated in FIG. 4, the inspection apparatus 63 has a casing 150. A loading and unloading port 150a through which a wafer W is loaded into and unloaded from the casing 150 is formed on one side wall of the casing 150.

Figure 5:
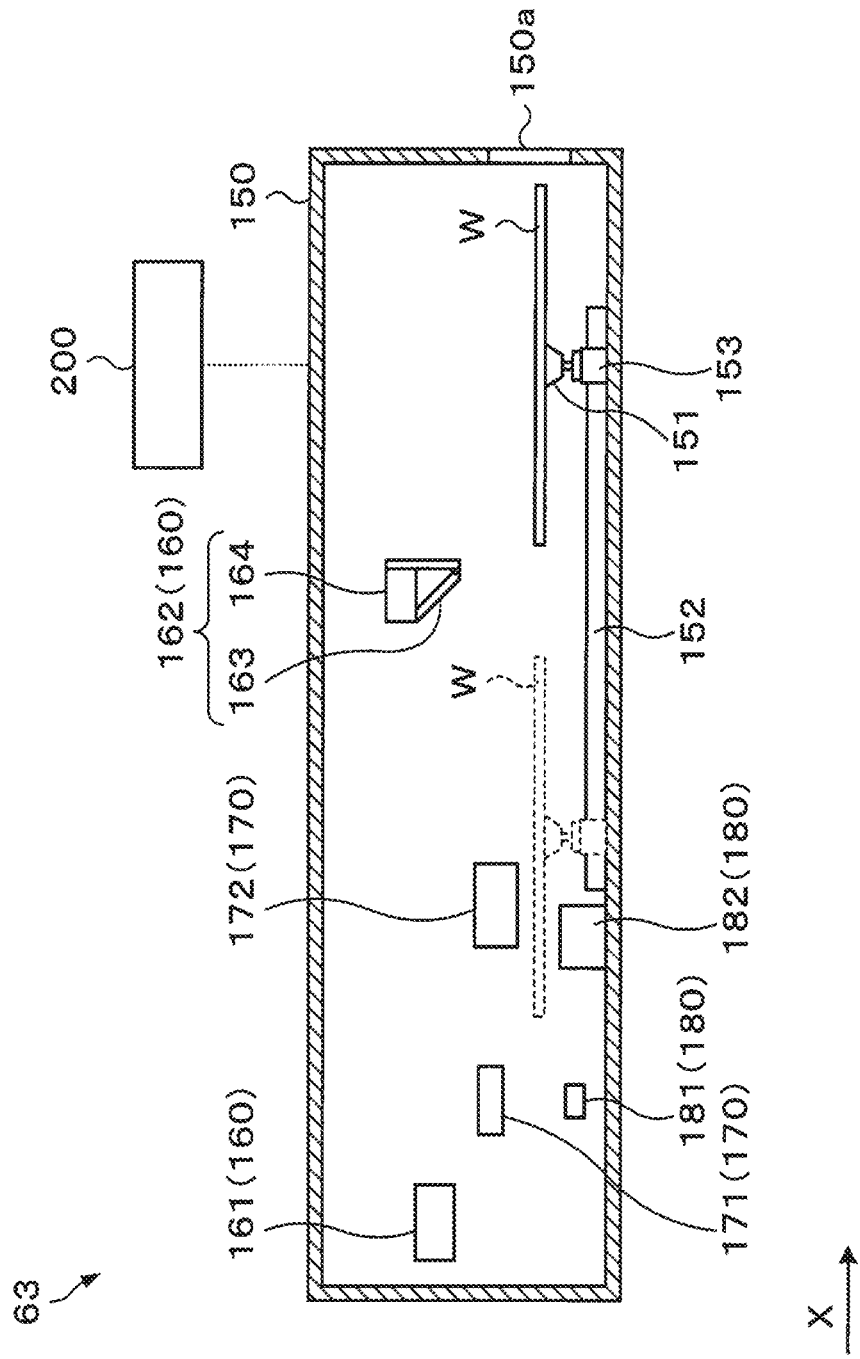
FIG. 5 is a longitudinal sectional view illustrating the outline of the configuration of the inspection apparatus.

In the casing 150, a wafer chuck 151 configured to hold a wafer W is provided as illustrated in FIG. 5. A guide rail 152 is provided on the bottom surface of the casing 150 and extends from one end side (the positive direction side in the X direction in FIG. 4) to the other end side (the negative direction side in the X direction negative direction). On the guide rail 152, a driving part 153 configured to rotate the wafer chuck 151 and to be movable along the guide rail 152 is provided. With this configuration, the wafer W held by the wafer chuck 151 is movable between a first position in the vicinity of the loading and unloading port 150a and a second position in the vicinity of a peripheral edge imaging subunit 170 and a rear surface imaging subunit 180.

In addition, a front surface imaging subunit 160, the peripheral edge imaging subunit 170, and the rear surface imaging subunit 180 are provided in the casing 150.

The front surface imaging subunit 160 has a camera 161 and an illumination module 162. The camera 161 is provided in the upper portion on the other end side (the negative direction side in the X direction in FIG. 4) in the casing 150, and has a lens (not illustrated) and an imaging element (not illustrated) such as a CMOS image sensor.

The illumination module 162 is provided in the central upper portion of the casing 150 and includes a half mirror 163 and a light source 164. The half mirror 163 is provided at a position facing the camera 161 and is inclined upward 45 degrees toward the camera 161 from the state in which the mirror surface of the half mirror 163 is directed vertically downward. The light source 164 is provided above the half mirror 163. The illumination from the light source 164 is radiated downward through the half mirror 163. In addition, the light having passed through the half mirror 163 is reflected by an object below the half mirror 163, is further reflected by the half mirror 163, and is taken into the camera 161. That is to say, the camera 161 can image an object existing in the area illuminated by the light source 164. Therefore, when the wafer chuck 151 holding the wafer W moves along the guide rail 152, the camera 161 can image the front surface of the wafer W, which is passing through an area illuminated by the light source 164. Then, data of an image captured by the camera 161 is input to the controller 200 described later.

Figure 6:
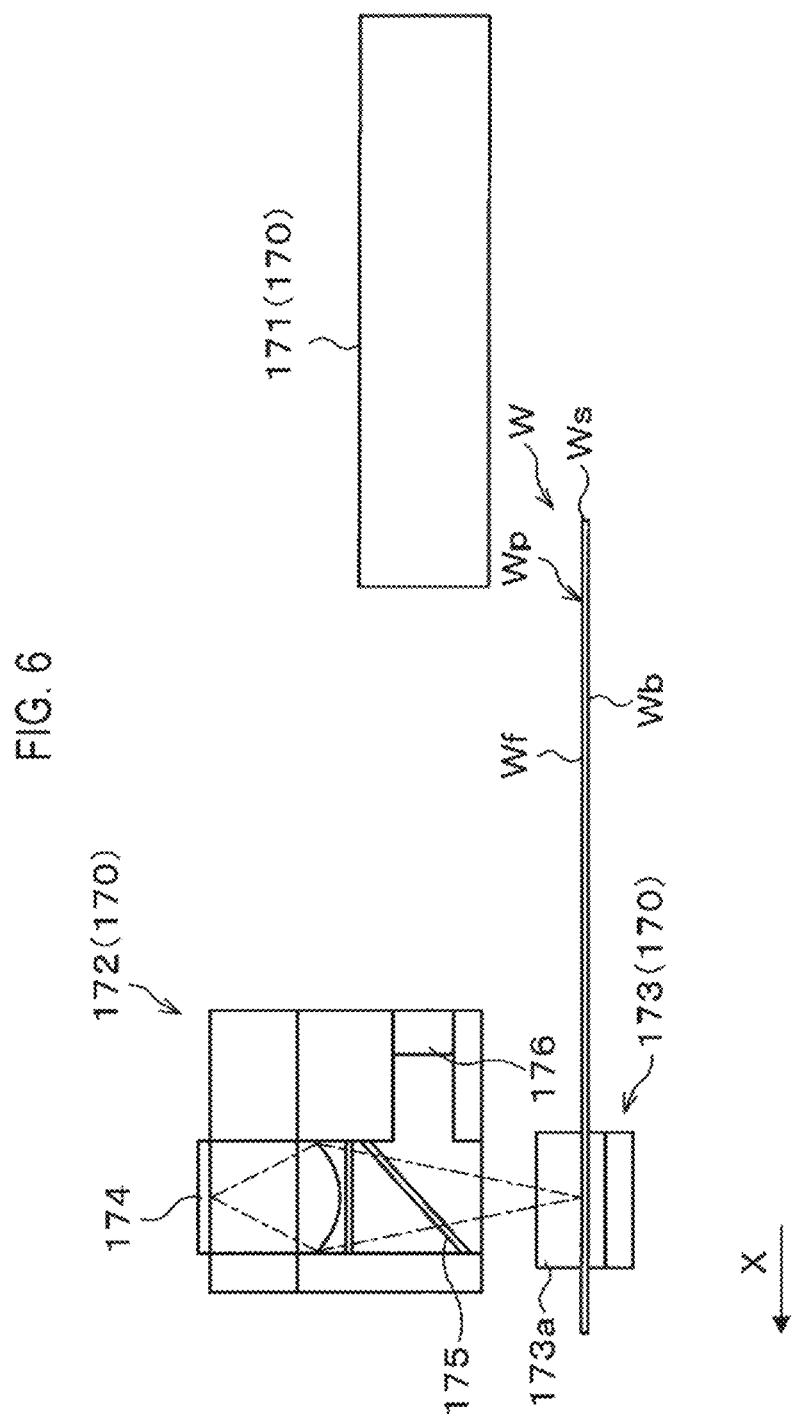
FIG. 6 is a side view illustrating the outline of a configuration of a peripheral edge imaging subunit.

As illustrated in FIGS. 4 to 6, the peripheral edge imaging subunit 170 includes a camera 171, an illumination module 172, and a mirror member 173. The camera 171 has a lens (not shown) and an imaging element (not illustrated) such as a CMOS image sensor.

The illumination module 172 is provided above the wafer W held by the wafer chuck 151, and has a light source 174, a half mirror 175, and a focusing lens 176. The light source 174 is provided above the half mirror 175. The half mirror 175 is provided at a position facing the camera 171 and is inclined upward 45 degrees toward the camera 171 from the state in which the mirror surface of the half mirror 175 is directed vertically downward. The focusing lens 176 is provided between the camera 171 and the half mirror 175. The focusing lens 176 is not particularly limited as long as the focusing lens 176 has a function of changing a combined focal length with the lens of the camera 171.

The mirror member 173 is provided below the illumination module 172, and has a reflection surface 173*a*.

When the wafer W held by the wafer chuck 151 is at the second position, the reflection surface 173*a* faces a lateral end face Ws and a peripheral edge area Wp in a rear surface Wb of the wafer W held by the wafer chuck 151.

In the illumination module 172, the light emitted from the light source 174 is radiated downward overall through the half mirror 175. When the wafer W held by the wafer chuck 151 is at the second position, the light, which has passed through the half mirror 175 and is diffused, is reflected from the peripheral edge area Wp in a front surface Wf of the wafer W located below the half mirror 175 or the reflection surface 173*a* of the mirror member 173. In addition, the light reflected by the reflection surface 173*a* is mainly radiated to the lateral end surface Ws (particularly, when a bevel is present at the edge of the wafer W, the upper end portion of the bevel) and the peripheral edge area Wp in the front surface Wf of the wafer W.

Figure 7:
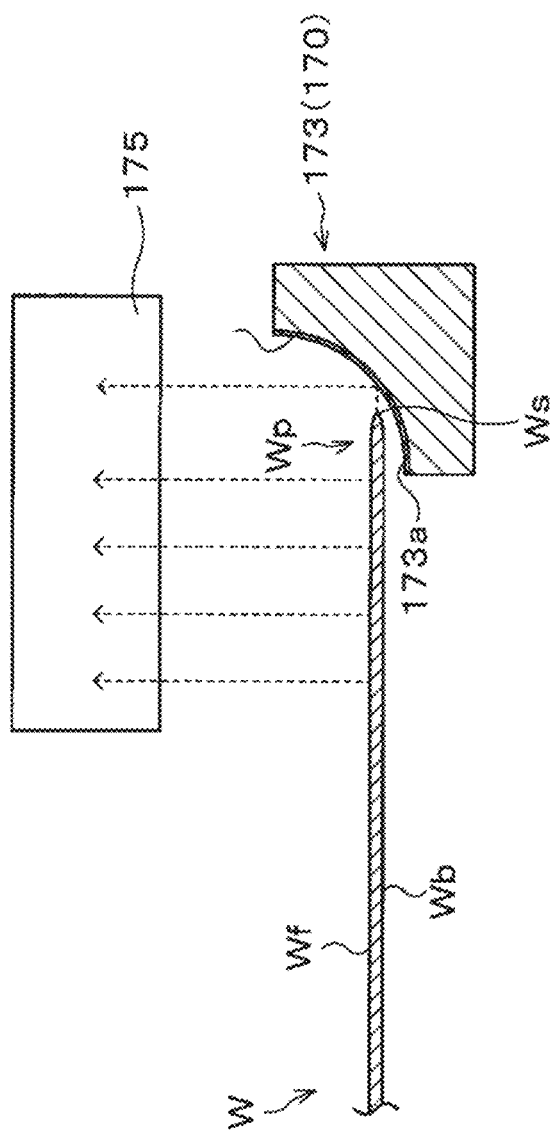
FIG. 7 is a view illustrating the reflection state of light from a peripheral portion of a substrate.

The light reflected from the peripheral edge area Wp in the front surface Wf of the wafer W is directed to the half mirror 175, rather than being directed to the reflection surface 173*a* of the mirror member 173, as illustrated in FIG. 7. Then, the light directed to the half mirror 175 is reflected again by the half mirror 175, and enters the camera 171 without passing through the focusing lens 176. Meanwhile, the light reflected from the lateral end surface Ws of the wafer W is sequentially reflected by the reflection surface 173*a* of the mirror member 173 and the half mirror 175, passes through the focusing lens 176, and enters the camera 171. As described above, the light from the peripheral edge area Wp in the front surface Wf of the wafer W and the light from the lateral end surface Ws of the wafer W are both input to the camera 171. That is to say, when the wafer W held by the wafer chuck 151 is located at the second position, the camera 171 can image both of the peripheral edge area Wp in the front surface Wf of the wafer W and the lateral end surface Ws of the wafer W. Data of an image captured by the camera 171 is input to the controller 200 described later.

By providing the focusing lens 176, both of the peripheral edge area Wp in the front surface Wf of the wafer W and the lateral end surface Ws of the wafer W become clear in the image captured by the camera 171.

As illustrated in FIG. 5, the rear surface imaging subunit 180 has a camera 181 and an illumination module 182.

The camera 181 is provided in the lower portion on the other end side (the negative direction side in the X direction in FIG. 5) in the casing 150, and has a lens (not illustrated) and an imaging element (not illustrated) such as a CMOS image sensor.

The illumination module 182 is disposed below the illumination module 172 and below the wafer W held by the wafer chuck 151. The illumination module 182 includes a half mirror (not illustrated) and a light source (not illustrated). The half mirror is provided at a position facing the camera 181 and is inclined downward 45 degrees toward the camera 181 from the state in which the mirror surface of the mirror is directed vertically upward. The light source is provided below the half mirror. The illumination from the light source is radiated upward through the half mirror. In addition, the light having passed through the half mirror is reflected by an object above the half mirror, is further reflected by the half mirror, and is taken into the camera 181. That is to say, the camera 181 can image an object existing in the area illuminated by the light source of the illumination module 182. Therefore, when the wafer W held by the wafer chuck 151 is located at the second position, the camera 181 can image the rear surface of the wafer W. Then, data of an image captured by the camera 181 is input to the controller 200 described later.

In the inspection apparatus 63 configured as described above, when the wafer W is located at the second position, the peripheral edge imaging subunit 170 and the rear surface imaging subunit 180 as imaging parts capture images in synchronization with the rotation of the wafer chuck 151 holding the wafer W. Therefore, for the entire peripheral portion of the wafer W, specifically, for the entire peripheral edge area Wp in the front surface Wf of the wafer W, the entire lateral end surface Ws of the wafer W, and the entire peripheral edge area Wp in the rear surface of wafer W, a substantially circumferentially scanned image is obtained.

The above-described substrate processing system 1 is provided with the controller 200 as illustrated in FIG. 1. The controller 200 is constituted with, for example, a computer including a CPU, memory, and the like, and includes a program storage (not illustrated). The program storage stores a program for controlling the processing of a wafer W in the substrate processing system 1. The program includes a program for controlling inspection of the wafer W performed based on an image of a substrate captured by the inspection apparatus 63. The program may be recorded in a computer-readable storage medium H, and may be installed in the controller 200 from the storage medium H. The control of the inspection may be performed not by the controller 200 dedicated to the inspection apparatus 63 but by an application program executed in an external computer apparatus connected to the substrate processing system 1.

Figure 8:
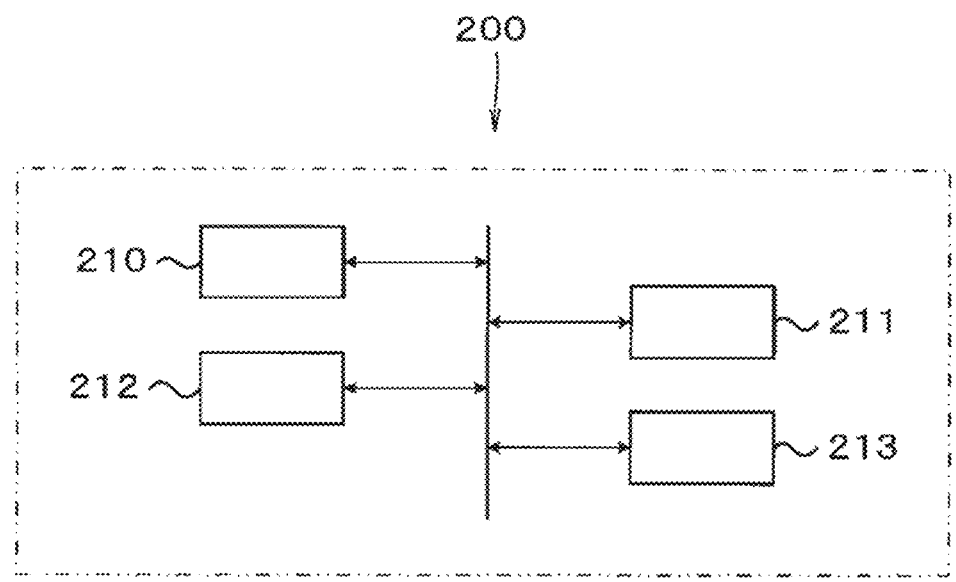
FIG. 8 is a block diagram schematically illustrating the outline of a configuration of a controller.

In addition, as illustrated in FIG. 8, the controller 200 includes an image acquisition part 210, a feature amount acquisition part 211, a determination part 212, and an inspection part 213.

The image acquisition part 210 acquires an inspection target peripheral edge image. The inspection target peripheral edge image is one of captured peripheral edge images which are images of the peripheral portion of the wafer W based on the imaging results of the peripheral edge imaging subunit 170 and the rear surface imaging subunit 180, and is related to an inspection target. Specifically, the image acquisition part 210 performs necessary image processes on the images captured by the peripheral edge imaging subunit 170 and the rear surface imaging subunit 180. As a result, for each of the peripheral edge area Wp in the front surface Wf of the wafer W as an inspection target, the lateral end surface Ws of the wafer W, and the peripheral edge area Wp in the rear surface of the wafer W, an image obtained by scanning the entire surface in the circumferential direction is obtained as the inspection target peripheral edge image.

When areas obtained by dividing a predetermined area in the image of the peripheral portion of the wafer W into a plurality of divided areas are taken as divided areas, the feature amount acquisition part 211 acquires a feature amount of each of the divided areas in the inspection target peripheral edge image acquired by the image acquisition part 210.

Figure 9:
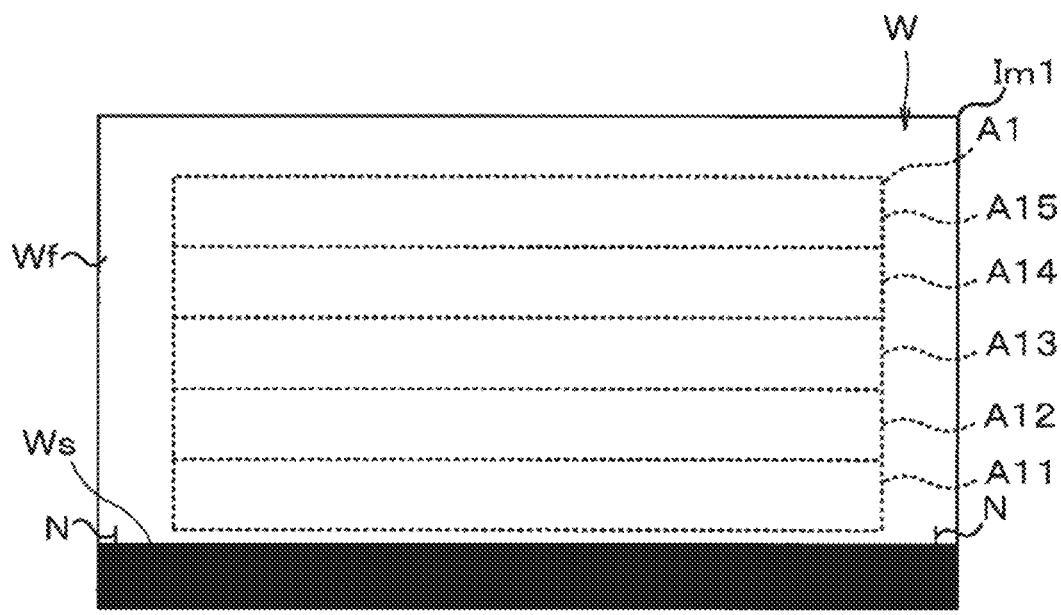
FIG. 9 is a view illustrating an example of an inspection target image.

For example, as illustrated in FIG. 9, the above-mentioned predetermined area A1 is the peripheral edge area Wp in the front surface Wf of the wafer W and does not include the lateral end surface Ws and the bevel of the wafer W. An image Im1 in FIG. 9 is an example of the inspection target peripheral edge image. In the image Im1, the circumferential direction of the wafer W matches the horizontal direction of the image, and the radial direction of the wafer W matches the vertical direction of the image. In addition, in the image Im1 in FIG. 9, symbol N denotes a notch.

In addition, in the example of FIG. 9, divided areas A1 to A15 are obtained by dividing the predetermined area A1 in the radial direction of the wafer W. When the predetermined area is divided in the radial direction of the wafer W, the size in the radial direction of each divided area is 0.5 mm or more.

The predetermined area, the division number of the predetermined area (the number of divided areas), and the size of each divided area (the width in the radial direction of the wafer W in this example) are set by, for example, a user.

In addition, the "feature amount of each divided area" is, for example, an average of pixel values in the corresponding divided area in a captured peripheral edge image such as the inspection target peripheral edge image or a reference peripheral edge image (described later).

The captured peripheral edge image is composed of three color components of RGB (Red, Green, Blue). Therefore, the average of the pixel values/luminance values of a specific color component in the corresponding divided area in the captured peripheral edge image may be set as the "feature amount of each divided area". In this example, it is assumed that the "feature amount of each divided area" is an average of pixel values/luminance values of a specific color component in the corresponding divided area in the captured peripheral edge image. In addition, the specific color may be set, for example, by the user.

The determination part 212 performs a predetermined determination on the inspection of the peripheral portion of the wafer W based on the acquisition result of the feature amount acquisition part 211. Types of the determination vary depending on the inspection desired by the user. The determination part 212 performs the determination based on, for example, the acquisition result of the feature amount acquisition part 211 and the feature amount of each divided area in the reference peripheral edge image, which is an image of the peripheral portion of the wafer and serves as a reference of the predetermined determination. More specifically, the determination part 212 compares, for each divided area, averages of pixel values of a specific color component in the corresponding divided area in the inspection target peripheral edge image and in the reference peripheral edge image, and performs the predetermined determination based on the comparison result. For example, as a result of comparison, when the magnitude of a difference between the averages in the corresponding divided area in the captured peripheral edge image and in the reference peripheral edge image is equal to or greater than a threshold, the determination part 212 determines that there is abnormality in the corresponding divided area. When the magnitude of the difference between the averages is less than the threshold, the determination part 212 determines that there is no abnormality in the corresponding divided area. The feature amount of each divided area in the reference peripheral edge image and the threshold are set in advance, and the setting may be performed, for example, by the user. The feature amount in the reference peripheral edge image and the threshold are stored in a storage (not illustrated).

Based on the determination result of the determination part 212, the inspection part 213 determines whether the inspection succeeds or fails. Specifically, when there are one or more divided areas determined to be abnormal in the determination part 212, the inspection part 213 determines that the inspection fails, and otherwise, the inspection part 213 determines that the inspection succeeds.

Figure 10A:
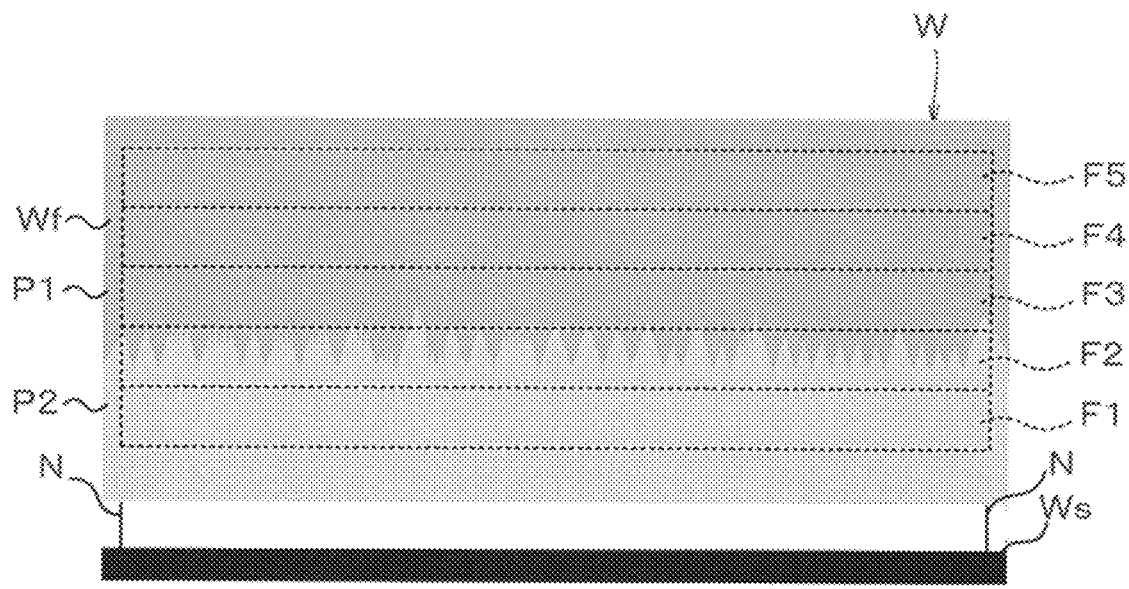
FIG. 10A is a view illustrating an example of a reference peripheral edge image.
Figure 10B:
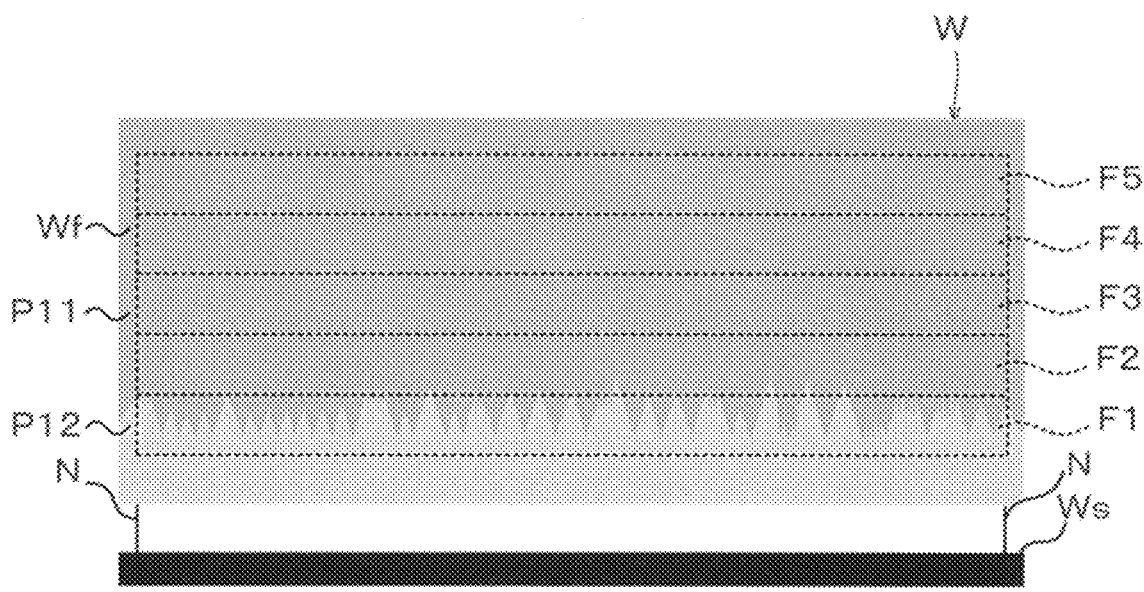
FIG. 10B is a view illustrating an example of an inspection target peripheral edge image.

FIGS. 10A and 10B are views illustrating specific examples of the determination in the determination part 212 and the inspection in the inspection part 213, in which FIG. 10A illustrates an example of a reference peripheral edge image and FIG. 10B illustrates an example of an inspection target peripheral edge image. The images illustrated in FIGS. 10A and 10B and thereafter are images of entire peripheral edge areas of peripheral portions in front or rear surfaces of wafers W, in which the horizontal direction of the images matches the circumferential direction of the wafers and the vertical direction of the images matches the radial direction of the wafers. In addition, the images illustrated in FIGS. 10A and 10B and thereafter are not actual ones, but are simplified images illustrated in a gray scale. It is assumed that the dark gray portions in the images of FIGS. 10A and 10B indicate blue in the actual images, and the light gray portions indicate light blue in the actual images. In the following description, each of slices F1 to F5 is set using the lateral end surface Ws of the wafer W as a reference. The slice F1 is a divided area, which is separated from the lateral end surface Ws of the wafer W by 1.0 mm to 1.5 mm in the radial direction. Similarly, the slices F2, F3, F4, and F5 are divided areas, which are separated from the lateral end surface Ws of the wafer W by 1.5 to 2 mm, 2 to 2.5 mm, 2.5 to 3 mm, and 3 to 3.5 mm in the radial direction, respectively.

Both of the image of FIG. 10A and the image of FIG. 10B are images of the entire peripheral edge areas in the front surfaces Wf of wafers W. Each of the images has a dark gray portion P1 or P11 and a gray portion P2 or P12, and the boundary between the dark gray portion P1 or P11 and the gray portion P2 or P12 is not smooth, but has a fine-tooth shape. It is difficult to detect such a boundary, i.e., the fine-tooth-shaped boundary between areas having a small difference between pixel values, using conventional methods (the above-mentioned surrounding comparison method and edge trace method). Therefore, in the conventional methods, it is impossible to determine the width of the gray portion P2 or P12 in an image having a boundary between the dark gray portion P1 or P11 and the gray portion P2 or P12, as illustrated in FIGS. 10A and 10B.

In the image of FIG. 10A, the width of the gray portion P2 is about 13 mm and is substantially constant in the circumferential direction of the wafer W, whereas in the image of FIG. 10B, the width of the gray portion P12 is substantially constant in the circumferential direction but is smaller than that in the image of FIG. 10A. Such a difference is caused by the processing conditions in wafer processing (including a difference in dissolution situation or film thickness behavior of coated films after processing).

An example of averages of pixel values of each color component in the slices F1 to F5 of the image of FIG. 10A is shown in Table 1, and an example of averages of pixel values of each color component in the slices F1 to F5 of the image of FIG. 10B is shown in Table 2.

TABLE 1

| Slice | R | G | B |
|---|---|---|---|
| F1 | 120 | 179 | 211 |
| F2 | 101 | 144 | 203 |
| F3 | 100 | 106 | 193 |
| F4 | 101 | 101 | 190 |
| F5 | 101 | 101 | 190 |

TABLE 2

| Slice | R | G | B |
|---|---|---|---|
| F1 | 124 | 182 | 208 |
| F2 | 104 | 136 | 190 |
| F3 | 101 | 107 | 190 |
| F4 | 102 | 104 | 193 |
| F5 | 102 | 103 | 192 |

Table 3 shows differences between the averages in the slices F1 to F5 in the image of FIG. 10A and the averages in the slices F1 to F5 in the image of FIG. 10B.

TABLE 3

| Slice | R | G | B |
|---|---|---|---|
| F1 | 4 | 3 | −3 |
| F2 | 3 | −8 | −4 |
| F3 | 1 | 1 | 3 |
| F4 | 1 | 3 | 3 |
| F5 | 1 | 2 | 2 |

It is assumed that, in the determination by the determination part 212, the image of FIG. 10A is used as a reference peripheral edge image, the averages of pixel values of the green (G) component of the image is used as determination parameters, and the threshold for the determination is set to, for example, five. Since the magnitude of the difference between the averages of pixel values of the green component in slice F2 exceeds the threshold, the determination part 212 determines that there is an abnormality in the slice F2 of the inspection target peripheral edge image in FIG. 10B. Then, the inspection part 213 determines that inspection fails for the wafer W shown in the inspection target peripheral edge image. That is to say, with the inspection apparatus 63, when the inspection target peripheral edge image as shown in FIG. 10B in which a macroscopic abnormality that the width of the gray portion P12 is narrow occurs is acquired, it may be determined that the inspection fails.

Figure 11A:
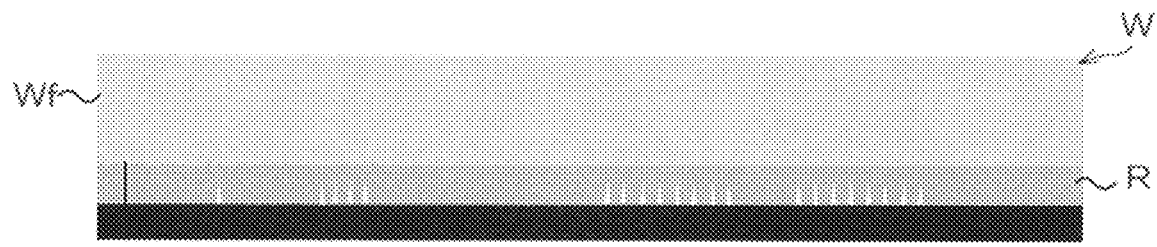
FIG. 11A is a view illustrating another example of a captured peripheral edge image.
Figure 11B:
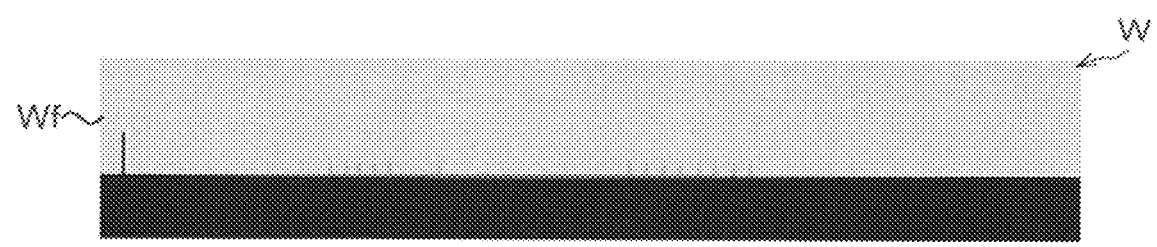
FIG. 11B is a view illustrating another example of a captured peripheral edge image.
Figure 11C:
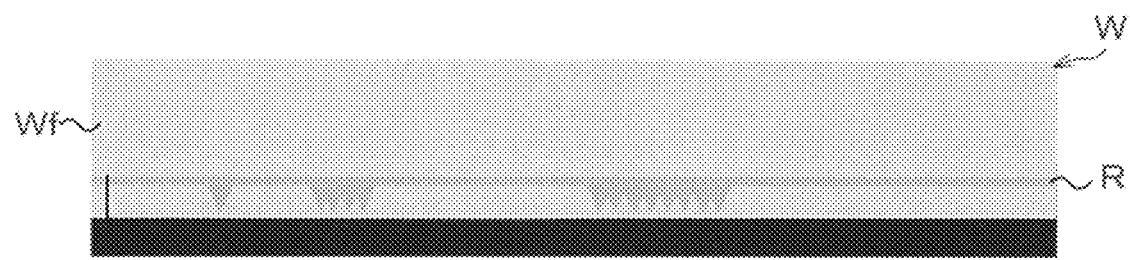
FIG. 11C is a view illustrating another example of a captured peripheral edge image.

FIGS. 11A to 11C are views illustrating other examples of captured peripheral edge images. The images in FIGS. 11A to 11C are images of entire peripheral edge areas in front surfaces Wf of wafers W, respectively. FIG. 11A illustrates a captured peripheral edge image of a wafer W on which an annular resist film R is formed along the peripheral portion of the wafer W. and FIG. 11B illustrates a captured peripheral edge image of a wafer W on which no resist film is formed on the peripheral portion of the wafer W. FIG. 11C is a captured peripheral edge image of a wafer W in which an edge of a resist film R on a side opposite to the peripheral end surface of the wafer W is clear but the resist film R is not formed on the peripheral end surface of the wafer W.

In the determination of the determination part 212, it is assumed that the image of FIG. 11A (or an image similar thereto) is used as a reference peripheral edge image, and the predetermined area is set such that an annular resist film formation area is included in the predetermined area. In addition, in the determination of the determination part 212, it is assumed that averages of luminance values of a specific color component in divided areas are used as parameters of the determination. Then, in the inspection apparatus 63, when an inspection target peripheral edge image as illustrated in FIG. 11A is acquired, the determination part 212 determines that no divided area is abnormal, and the inspection part 213 determines that the inspection succeeds. In addition, when an inspection target peripheral edge image as illustrated in FIG. 11B is acquired, the determination part 212 determines that there is an abnormality in a divided area near to the lateral end surface, and the inspection part 213 determines that the inspection fails. Furthermore, when an inspection target peripheral edge image as illustrated in FIG. 11C including an abnormality that cannot be detected by the conventional method is acquired, the determination part 212 determines that there is an abnormality in one of the divided areas, and the inspection part 213 determines that the inspection fails. That is to say, with the inspection apparatus 63, it is possible to more accurately detect the presence or absence of a macroscopic abnormality such as a macroscopic coating failure, and to perform more accurate inspection based on the detection result.

Next, a process performed on a wafer W using the substrate processing system 1 configured as described above will be described.

In the processing of a wafer W, first, a cassette C accommodating a plurality of wafers W is placed on a predetermined placement plate 21 of the cassette station 10. Then, each of the respective wafers W in the cassette C is sequentially taken out by the wafer transfer apparatus 23 and is transferred to, for example, the delivery apparatus 53 of the third block G3 of the processing station 11.

Next, the wafer W is transferred by the wafer transfer apparatus 70 to the heat treatment apparatus 40 of the second block G2 and is subjected to a temperature adjustment process. Thereafter, the wafer W is transferred by the wafer transfer apparatus 70 to, for example, the lower antireflective film forming apparatus 31 of the first block G1, and a lower antireflective film is formed on the wafer W. Thereafter, the wafer W is transferred to the heat treatment apparatus 40 of the second block G2, are subjected to a heating process such that the temperature of the wafer W is adjusted.

Next, the wafer W is transferred to the adhesion apparatus 41 and is subjected to an adhesion process. Thereafter, the wafer W is transferred to the resist coating apparatus 32 of the first block G1, and a resist film is formed on the wafer W.

Next, the wafer W is transferred to the upper antireflective film forming apparatus 33 of the first block G1, and an upper antireflective film is formed on the wafer W. Thereafter, the wafer W is transferred to the heat treatment apparatus 40 of the second block G2, and is subjected to a heating process. Thereafter, the wafer W is transferred to the periphery exposure apparatus 42 and is subjected to a periphery exposure process.

Next, the wafers W is transferred by the wafer transfer apparatus 70 to the delivery apparatus 52, and is transferred by the shuttle transfer apparatus 80 to the delivery apparatus 62 of the fourth block G4. Thereafter, the wafer W is transferred by the wafer transfer apparatus 100 of the interface station 13 to the inspection apparatus 63.

In the inspection apparatus 63, when the wafer W is moved to the above-mentioned second position, the peripheral edge imaging subunit 170 and the rear surface imaging subunit 180 capture images in synchronization with the rotation of the wafer chuck 151 holding the wafer W. The imaging result is input to the controller 200, and the image acquisition part 210 acquires a captured peripheral edge image of the wafer W. Next, the feature amount acquisition part 211 acquires the feature amount of each of the divided areas in the captured peripheral edge image acquired by the image acquisition part 210. Subsequently, the determination part 212 performs a predetermined determination on inspection of the peripheral portion of the wafer W based on the acquisition result of the feature amount acquisition part 211. Then, the inspection part 213 determines whether the inspection succeeds or fails based on the determination result of the determination part 212.

When it is determined that the inspection fails due to a defect, the wafer W is transferred by the wafer transfer apparatus 70 to the delivery apparatus 50 of the third block G3 without being subjected to an exposure process and the subsequent processes. Thereafter, the wafer W is transferred by the wafer transfer apparatus 23 of the cassette station 10 to the cassette C of a predetermined placement plate 21.

Meanwhile, when it is determined that the inspection succeeds, the wafer W is transferred by the wafer transfer apparatus 100 of the interface station 13 to the exposure apparatus 12, and is subjected to an exposure process with a predetermined pattern. Next, the wafer W is transferred by the wafer transfer apparatus 100 to the delivery apparatus 60 of the fourth block G4. Thereafter, the wafer W is transferred by the wafer transfer apparatus 70 to the heat treatment apparatus 40, and is subjected to a post-exposure baking process. Next, the wafer W is transferred by the wafer transfer apparatus 70 to the developing apparatus 30, and a development process is performed on the wafer W.

After completion of the development process, the wafer W is transferred to the heat treatment apparatus 40 and is subjected to a post-baking process. Next, the wafer W is transferred by the wafer transfer apparatus 70 to the delivery apparatus 50 of the third block G3. Thereafter, the wafer W is transferred by the wafer transfer apparatus 23 of the cassette station 10 to the cassette C of a predetermined cassette placement plate 21, and a series of photolithography steps are completed. Then, the series of photolithography steps are also performed on the subsequent wafers W in the same cassette C.

According to the present embodiment, a predetermined area in an inspection target peripheral edge image is divided into relatively large divided areas, and a determination on the inspection of the peripheral portion of a wafer W is performed for each divided area based on the feature amount of the divided area. Therefore, it is possible to accurately detect a macroscopic abnormality such as a large-scale coating failure.

In the surrounding comparison method used as the conventional abnormality detection method, an allowable coating unevenness may be erroneously detected as a defect. However, according to the present embodiment, such a coating unevenness is not erroneously detected as a defect.

In the case of forming an annular resist film along the peripheral edge area in the front surface of a wafer W, when a large linear defect exists near the inner end of the resist film, the edge trace method or the like may erroneously recognize the large linear defect as the inner end of the annular resist film. When such erroneous recognition is made, it is impossible to accurately inspect the quality of the annular resist film. According to the present embodiment, it is possible to accurately inspect the forming state of a resist film without erroneously recognize such a large linear defect as the inner end of the annular resist film.

In order to indicate information on a wafer W, a laser mark formed of a plurality of dots may be formed in some cases in the peripheral edge area in the rear surface of the wafer W. In the conventional methods, this laser mark may be erroneously recognized as an edge of a resist film. In addition, in the conventional methods, a boat mark, which may be formed on the peripheral portion of a wafer W, may be erroneously recognized as a defect. However, in the present embodiment, the laser mark or the boat mark is not erroneously recognized since the laser mark formation area and the boat mark formation area are excluded from the predetermined area as exclusion areas when setting the above-described predetermined area. Although the position of the laser mark formation area is constant, the position of the boat mark formation area differs in each wafer W. Therefore, when the boat mark formation area is treated as the exclusion area, a distinguishing shape (pattern) of the boat mark may be registered so as to automatically recognize the boat mark formation area based on the registered pattern.

In the above example, the feature amount acquisition part 211 acquires the feature amount in the peripheral edge area Wp in the front surface Wf of the wafer W as an inspection target. However, the feature amount acquisition part 211 may be configured to acquire the feature amount in the peripheral edge area Wp in the rear surface Wb of the wafer W as an inspection target.

Figure 12A:
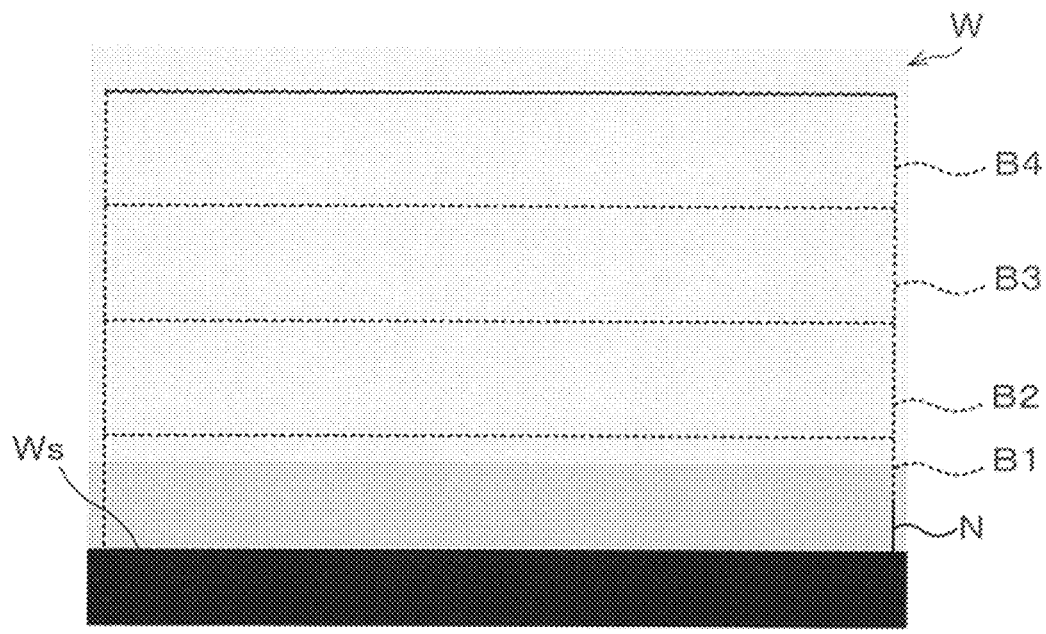
FIG. 12A is a view illustrating a specific example of determination in a determination part and inspection in an inspection part.
Figure 12B:
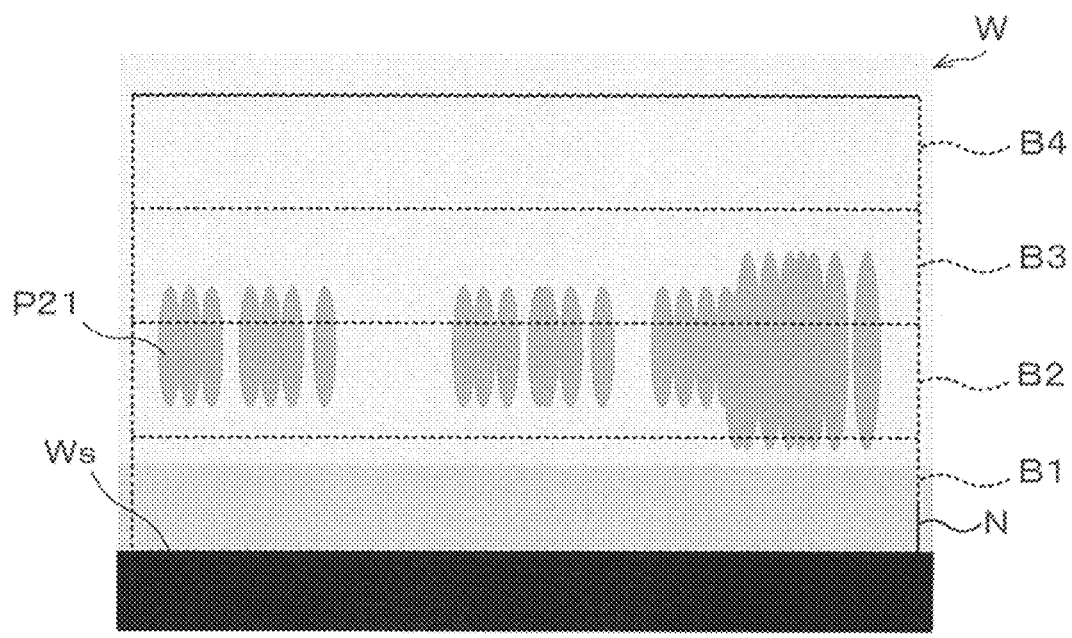
FIG. 12B is a view illustrating a specific example of determination in the determination part and inspection in the inspection part.

FIGS. 12A and 12B are views illustrating specific examples of the determination by determination part 212 and the inspection by inspection part 213 in the case of acquiring the feature amount in the peripheral edge area Wp in the rear surface Wb of the wafer W. FIG. 12A illustrates an example of a reference peripheral edge image, and FIG. 12B illustrates an example of an inspection target peripheral edge image. It is assumed that the dark gray portions in the images of FIGS. 12A and 12B indicate red in actual images, and the light gray portions indicate orange in the actual images. In the following description, a line B1 indicates a divided area of 0 mm to 3 mm from the lateral end surface Ws of a wafer W, and similarly, the lines B2, B3, and B4 respectively indicate divided areas of 3 to 6 mm, 6 to 9 mm, and 9 to 12 mm from the lateral end surface Ws of the wafer W.

Both of the image of FIG. 12A and the image of FIG. 12B are images of the peripheral edge areas Wp in the rear surfaces Wb of wafer W and are images based on a light gray (red) component. The image of FIG. 12B has large dark gray portions P21 generated due to a macroscopic defect, which does not exist in the image of FIG. 12A. When the area having a different color is large as shown in FIG. 12B, it is difficult to detect abnormality by the conventional methods.

An example of averages of pixel values of the red component in each of the lines B1 to B4 of the image of FIG. 12A is shown in Table 4, and an example of averages of pixel values of the red component in each of the lines B1 to B4 of the image of FIG. 12B is shown in Table 5.

TABLE 4

| Line | R |
|---|---|
| B1 | 92 |
| B2 | 188 |
| B3 | 197 |
| B4 | 199 |

TABLE 5

| Line | R |
|---|---|
| B1 | 90 |
| B2 | 172 |
| B3 | 167 |
| B4 | 195 |

In the determination by the determination part 212, it is assumed that the image of FIG. 12A is used as a reference peripheral edge image, the averages of pixel values of the red component of the image are used as determination parameters, and the threshold for the determination is set to, for example, five. Since the magnitude of the difference between the averages of pixel values of red components in the reference peripheral edge image in FIG. 12A and in the inspection target peripheral edge image in FIG. 12B exceeds the threshold in the lines B2 and B3, the determination part 212 determines that there is an abnormality in the divided area corresponding to the lines B2 and B3. Then, the inspection part 213 determines that inspection fails for the wafer W shown in the inspection target peripheral edge image. That is to say, with the inspection apparatus 63, when the inspection target peripheral edge image as shown in FIG. 12B in which a macroscopic abnormality occurs is acquired, it may be determined that the inspection fails.

In the above example, areas obtained by dividing a predetermined area in an image of a peripheral portion of a substrate in the radial direction are used as divided areas. However, the divided areas may be obtained by dividing the predetermined area in the circumferential direction. In the case of dividing the predetermined area in the circumferential direction, the circumferential width of the divided areas is, for example, 30° to 60°. In the above example, the average of pixel values of a specific color component in a divided area is acquired as the feature amount of the divided area. Alternatively, a standard deviation of pixel values in a divided area may be acquired as the feature amount of the divided area.

Figure 13A:
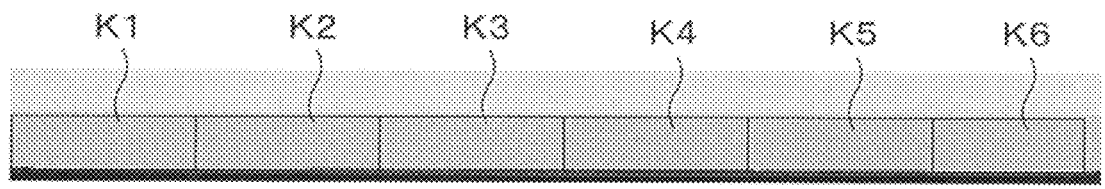
FIG. 13A is a view illustrating another specific example of determination in the determination part and inspection in the inspection part.
Figure 13B:
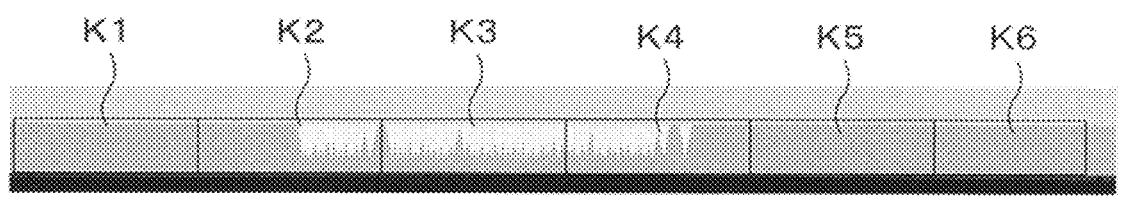
FIG. 13B is a view illustrating another specific example of determination in the determination part and inspection in the inspection part.
Figure 13C:
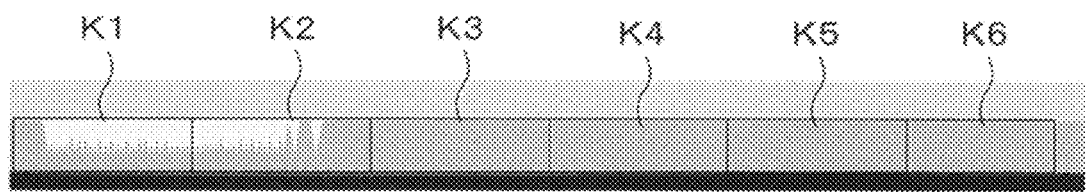
FIG. 13C is a view illustrating another specific example of determination in the determination part and inspection in the inspection part.
Figure 13D:
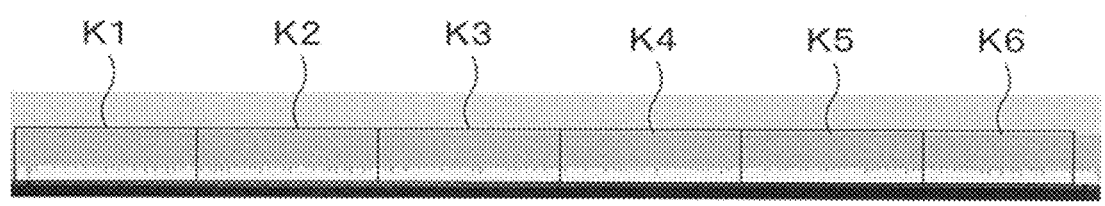
FIG. 13D is a view illustrating another specific example of determination in the determination part and inspection in the inspection part.

FIGS. 13A to 13D are views illustrating specific examples of determination by the determination part 212 and inspection by the inspection part 213 in the case of obtaining divided areas by dividing the predetermined area in the circumferential direction and acquiring a standard deviation of pixel values in a divided area as a feature amount of the divided area. FIG. 13A illustrates an example of a reference peripheral edge image, and FIGS. 13B to 13D illustrate examples of inspection target peripheral edge images, respectively. It is assumed that the light gray portions in the images of FIGS. 13A to 13D indicate orange in actual images, and the dark gray portions indicate blue in the actual images. In the following description, a block K1 is a divided area that occupies a range of 0° to 60° from a notch in a wafer W. Similarly, blocks K2, K3, K4, K5, and K6 respectively indicate divided areas of 60° to 120°, 120° to 180°, 180° to 240°, 240° to 300°, and 300° to 360° from the notch in the wafer W.

The image of FIG. 13A and the image of FIG. 13D are captured peripheral edge images of wafers W, each of which has an annular film formed well on a peripheral edge of a resist film along the peripheral edge of the resist film. The pixel values in the image of FIG. 13D are higher than the pixel values in the image of FIG. 13A. The image of FIG. 13B and the image of FIG. 13C are captured peripheral edge images of wafers W, each of which has an annular film formed partially on the peripheral edge of the resist film.

Examples of differences between the averages of pixel values of respective color components in each block of the image of FIG. 13B and those of the image of FIG. 13A and between the standard deviations of pixel values of respective color components in each block of the image of FIG. 13B and those of the image of FIG. 13A are shown in Table 6. Examples of differences between the averages of pixel values of respective color components in each block of the image of FIG. 13C and those of the image of FIG. 13A and between the standard deviations of pixel values of respective color components in each block of the image of FIG. 13C and those of the image of FIG. 13A are shown in Table 7. Examples of differences between the averages of pixel values of respective color components in each block of the image of FIG. 13D and those of the image of FIG. 13A and between the standard deviations of pixel values of respective color components in each block of the image of FIG. 13D and those of the image of FIG. 13A are shown in Table 8.

TABLE 6

| | K1 | | | K2 | | | K3 | | | K4 | | | K5 | | | K6 | | |
|---|---|---|---|---|---|---|---|---|---|---|---|---|---|---|---|---|---|---|
| | R | G | B | R | G | B | R | G | B | R | G | B | R | G | B | R | G | B |
| Average | −16 | 3 | 9 | −11 | 5 | 11 | −9 | 3 | 7 | −2 | −2 | 6 | −4 | 0 | −2 | −11 | 1 | 2 |
| Standard Deviation | 0.34 | −1.5 | 2.1 | 12.6 | 9.1 | 5.7 | 17.9 | 11.7 | 5.7 | 11.5 | 6.4 | 4.4 | 5.9 | 1.8 | 0.4 | 4.2 | −1.7 | −0.6 |

TABLE 7

|  | K1 | | | K2 | | | K3 | | | K4 | | | K5 | | | K6 | | |
| --- | --- | --- | --- | --- | --- | --- | --- | --- | --- | --- | --- | --- | --- | --- | --- | --- | --- | --- |
|  | R | G | B | R | G | B | R | G | B | R | G | B | R | G | B | R | G | B |
| Average | −5 | 4 | 11 | −7 | 4 | 9 | −9 | 3 | 1 | 2 | 2 | −2 | −1 | 3 | −1 | −9 | 2 | 2 |
| Standard Deviation | 11.5 | 9.4 | 5.6 | 10.4 | 8.3 | 4.8 | 2.9 | 0.6 | 0.1 | −2.2 | 0.4 | −1.9 | −0.1 | 0.9 | −1.9 | 3.2 | 0.2 | 0 |

TABLE 8

|  | K1 | | | K2 | | | K3 | | | K4 | | | K5 | | | K6 | | |
| --- | --- | --- | --- | --- | --- | --- | --- | --- | --- | --- | --- | --- | --- | --- | --- | --- | --- | --- |
|  | R | G | B | R | G | B | R | G | B | R | G | B | R | G | B | R | G | B |
| Average | −6 | 4 | 8 | −11 | 7 | 7 | −9 | 5 | 4 | 3 | 3 | 6 | −3 | 4 | 3 | −8 | 2 | 4 |
| Standard Deviation | 15.7 | 6.78 | 9.7 | 14.4 | 6.8 | 9.9 | 14.1 | 7.1 | 8.9 | 11.7 | 6.9 | 8.6 | 14.1 | 6.3 | 8.4 | 18 | 5.9 | 8.1 |

In the determination by the determination part 212, it is assumed that the image of FIG. 13A is used as a reference peripheral edge image, the averages of pixel values of the red (R) component of the image are used as determination parameters, and the threshold for the determination is set to, for example, ten. In addition, when it is determined that there is an abnormality even in any one block (divided area), the inspection part 213 determines that the inspection fails. Then, in each of the image of FIG. 13B, the image of FIG. 13C, and the image of FIG. 13D, the average of the pixel values of the red component exceeds the threshold in at least one block. Therefore, when these images are acquired as inspection target peripheral edge images, the determination part 212 determines that there is an abnormality and the inspection part 213 determines that the inspection fails. That is to say, even when the image of FIG. 13D in which the annular film is formed well on the peripheral edge of the resist film along the peripheral edge of the resist film is acquired as a captured peripheral edge image of the wafer W, it may be determined that the inspection fails.

Therefore, the feature amount acquisition part 211 and the determination part 212 are configured as follows.

The feature amount acquisition part 211 acquires a standard deviation of the pixel values of each color component in each block (divided area) of an inspection target peripheral edge image as the feature amount of the divided area of the inspection target peripheral edge image.

Then, the determination part 212 calculates, for each block, a difference between the standard deviation of a specific color component (red component in this example) in the inspection target peripheral edge image and the standard deviation of the specific color component in the reference peripheral edge image. When the difference falls within a predetermined range, the determination part 212 determines that there is no abnormality in the corresponding block of the inspection target peripheral edge image, and when the difference does not fall within the predetermined range, the determination part 212 determines that there is an abnormality.

Here, it is assumed that in the determination by the determination part 212, the image in FIG. 13A is used as the reference peripheral edge image, standard deviations of pixel values of the red (R) component are used as the feature amounts, and the predetermined range concerning the determination is set to, for example, ten to nineteen. Then, the image of FIG. 13B and the image of FIG. 13C have blocks having a difference in the standard deviation of the red component with respect to the reference peripheral edge image (the image of FIG. 13A) not falling within the predetermined range. In contrast, in the image of FIG. 13D, all blocks have a difference in the standard deviation of the red component with respect to the reference peripheral edge image (the image of FIG. 13A) falling within the predetermined range. Therefore, only when the image of FIG. 13B and the image of FIG. 13C are acquired as the inspection target peripheral edge image, the determination part 212 determines that there is an abnormality and the inspection part 213 determines that the inspection fails. When the image of FIG. 13D is acquired as the inspection target peripheral edge image, the determination part 212 does not determine that there is an abnormality, and the inspection part 213 determines that the inspection succeeds. Therefore, according to the present embodiment, it is possible to accurately inspect the presence or absence of a macroscopic coating failure.

When an area divided in the radial direction is used as a divided area, an average of pixel values in the divided area may be used as a feature amount. In addition, when an area divided in the circumferential direction is used as a divided area, a standard deviation of pixel values in the divided area may be used as a feature amount.

In the above example, the divided areas are areas obtained by dividing a predetermined area in an image of the peripheral portion of a substrate in any one of the circumferential direction and the radial direction. However, the divided areas may be areas divided in both of the circumferential direction and the radial direction. By using areas divided in both of the circumferential direction and the radial direction as the divided areas, it is possible to more accurately detect an area in which an abnormality occurs.

In addition, although only one of the peripheral edge area in the front surface and the peripheral edge area in the rear surface of a wafer W is included in the predetermined area from which the feature amount is acquired, both of the peripheral edge area in the front surface and the peripheral edge area in the rear surface may be included in the predetermined area.

In the case in which both of the peripheral edge area in the front surface and the peripheral edge area in the rear surface of a wafer W are included in the predetermined area, the divided areas may be similarly defined in the front and rear surfaces, and when there is an abnormality in both of a divided area in the front surface and a divided area in the rear surface that is located at the rear side of the divided area in the front surface, it may be determined that the inspection fails.

Alternatively, the determination part 212 may perform the determination by including only the peripheral edge area in the front surface of a wafer W in the predetermined area, and when there is a divided area determined to be abnormal, the determination part 212 may perform additional determination by including only the peripheral edge area in the rear surface of the wafer W in the predetermined area. Alternatively, the determination part 212 may perform the determination by including only the peripheral edge area in the rear surface of the wafer W in the predetermined area, and when there is a divided area determined to be abnormal, the determination part 212 may perform additional determination by including only the peripheral edge area in the front surface of the wafer W in the predetermined area.

In the case of performing such additional determination, the additional determination may be performed by further dividing the divided area on the rear side of the divided area determined to be abnormal in the previous determination.

In addition, the predetermined area may include not only the peripheral edge area in the front surface and/or the peripheral edge area in the rear surface of the wafer W, but also the lateral end surface of the wafer.

In addition, the predetermined area may be set such that a bevel is excluded from the predetermined area based on the detection result of the edge of the wafer W or the like. In addition, the predetermined area may be set based on the detection result of the edge of the wafer W or the like such that only a part outer than a part including a region in which the bevel is formed is included in the predetermined area.

Unlike the above example, as a feature amount of a divided area in a captured peripheral edge image, a histogram of pixel values in the divided area may be extracted. In this case, for example, when a pixel value having dissociation in frequency from the reference peripheral edge image equal to or greater than a predetermined value exists in the divided area, the determination part 212 determines that there is an abnormality.

In addition, the setting of the predetermined area in an image of the peripheral portion of a substrate, the division number of the predetermined area, and the size of each divided area is performed by, for example, the user. At the time of this setting, a reference peripheral edge image or the like may be displayed on a display (not illustrated).

The reference peripheral edge image may be produced by: manufacturing a wafer W having no abnormality in a peripheral portion of the wafer W; and producing the reference peripheral edge image based on the imaging result of the wafer W by the inspection apparatus 63. Alternatively, the reference peripheral edge image may be produced by: performing a photolithography process on a plurality of (for example, several lots of) wafers W; imaging each wafer W by the inspection apparatus 63 during the photolithography process; and producing the reference peripheral edge image based on the imaging result. In this case, the reference peripheral edge image may be produced by averaging the pixel values of captured peripheral edge images of the wafers, or by displaying the captured peripheral edge images of the wafers on a display and selecting one among the captured peripheral edge images as the reference peripheral edge image.

The setting of above-mentioned "threshold," "predetermined range," and specific color components related to the feature amount ma) be performed by the user in the same manner as described above by: actually performing the photolithography process on a plurality of wafers; displaying pixel values or the like based on the imaging results captured during the photolithography process; and performing the setting by the user based on the displayed results. Alternatively, the "threshold" and the like may be automatically set according to the feature amount of the reference peripheral edge image.

Only the feature amount of each divided area of the reference peripheral edge image may be set without setting or selecting the reference peripheral edge image.

The mounting position of the inspection apparatus 63 is not limited to the block G4, and may be mounted on any of the blocks G1 to G3.

In the above description, the inspection target peripheral edge image is based on the imaging result of the inspection apparatus 63 in the substrate processing system 1. However, the inspection target peripheral edge image may be based on an imaging result of an inspection apparatus or an imaging apparatus outside the substrate processing system 1.

Further, in the above description, the inspection is performed on a resist film formed on a wafer W in the manufacturing process of a semiconductor device. However, the technique according to the present disclosure is also applicable to other inspections which are performed in various processes related to a semiconductor device manufacturing process.

It shall be understood that the embodiments disclosed herein are examples in all respects and are not restrictive. The above-described embodiments may be omitted, replaced, or modified in various forms without departing from the scope and spirit of the appended claims.

In addition, the following configurations also belong to the technical scope of the present disclosure.

(1) A substrate inspection method including: a feature amount acquisition step of acquiring a feature amount of each of divided areas in an inspection target peripheral edge image, the inspection target peripheral edge image being an image of a peripheral portion of a target substrate as an inspection target, the divided areas being obtained by dividing a predetermined area in the image of the peripheral portion of the target substrate into a plurality of areas; and a determination step of performing a predetermined determination concerning inspection of the peripheral portion of the target substrate based on an acquisition result in the feature amount acquisition step.

In item (1), a predetermined area in an inspection target peripheral edge image is divided into divided areas, and a determination on the inspection of a peripheral portion of a substrate is performed for each divided area based on the feature amount of the corresponding divided area. Therefore, it is possible to accurately detect a macroscopic abnormality such as a large-scale coating failure.

(2) The substrate inspection method described in item (1), wherein, the determination step includes performing the predetermined determination based on the acquisition result in the feature amount acquisition step and a feature amount of each of divided areas in a reference peripheral edge image, the reference peripheral edge image being an image of a peripheral portion of a reference substrate as a reference of the predetermined determination.

(3) The substrate inspection method described in item (1) or (2), wherein the feature amount is an average of pixel values in each of the divided areas.

(4) The substrate inspection method described in any one of items (1) to (3), wherein the feature amount is a standard deviation of pixel values in each of the divided areas.

(5) The substrate inspection method described in any one of items (1) to (4), wherein the feature amount is a histogram of pixel values in each of the divided areas.

(6) The substrate inspection method described in any one of items (3) to (5), wherein the feature amount is an amount related to pixel values of a specific color.

(7) The substrate inspection method described in any one of items (1) to (6), wherein the divided areas are obtained by dividing the predetermined area in a radial direction of the substrate.

(8) The substrate inspection method described in any one of items (1) to (7), wherein the divided areas are obtained by dividing the predetermined area in a circumferential direction of the substrate.

(9) The substrate inspection method described in any one of items (1) to (8), further including an imaging step of imaging the peripheral portion of the target substrate, wherein the inspection target peripheral edge image is an image of the peripheral portion of the target substrate based on an imaging result in the imaging step.

(10) A substrate inspection apparatus including: a feature amount acquisition part configured to acquire a feature amount of each of divided areas in an inspection target peripheral edge image, the inspection target peripheral edge image being an image of a peripheral portion of a substrate as an inspection target and based on an imaging result in an imaging part, the divided areas being obtained by dividing a predetermined area in the image of the peripheral portion of the substrate into a plurality of areas; and a determination part configured to perform a predetermined determination concerning inspection of the peripheral portion of the substrate based on an acquisition result in the feature amount acquisition part.

According to the present disclosure, it is possible to accurately detect macroscopic abnormalities in the peripheral portion of a substrate when inspecting the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate inspection method comprising:
   acquiring a first feature amount of each of divided areas in an inspection target peripheral edge image, the inspection target peripheral edge image being an image of a peripheral portion of a target substrate as an inspection target, the divided areas being obtained by dividing a predetermined area in the image of the peripheral portion of the target substrate into a plurality of areas; and
   performing a predetermined determination concerning inspection of the peripheral portion of the target substrate based on an acquisition result in the acquiring the first feature amount,
   wherein the predetermined determination in each of the divided areas is performed by comparing the first feature amount of each of the divided areas in the inspection target peripheral edge image with a second feature amount of each of divided areas in a reference peripheral edge image, the reference peripheral edge image being an image of a peripheral portion of a reference substrate as a reference of the predetermined determination,
   wherein each of the divided areas has a rectangular shape having an identical width, and
   wherein the first feature amount is an average of pixel values in each of the divided areas having the identical width.

2. The substrate inspection method of claim 1, wherein the first feature amount is an amount related to pixel values of a specific color.

3. The substrate inspection method of claim 1, wherein the divided areas are obtained by dividing the predetermined area in a radial direction of the target substrate.

4. The substrate inspection method of claim 1, wherein the divided areas are obtained by dividing the predetermined area in a circumferential direction of the target substrate.

5. The substrate inspection method of claim 1, further comprising:
   imaging the peripheral portion of the target substrate,
   wherein the inspection target peripheral edge image is an image of the peripheral portion of the target substrate based on an imaging result in the imaging the peripheral portion.

6. A substrate inspection apparatus comprising:
   a first feature amount acquisition part configured to acquire a first feature amount of each of divided areas in an inspection target peripheral edge image, the inspection target peripheral edge image being an image of a peripheral portion of a substrate as an inspection target, the divided areas being obtained by dividing a predetermined area in the image of the peripheral portion of the substrate into a plurality of areas; and
   a determination part configured to perform a predetermined determination concerning inspection of the peripheral portion of the substrate based on an acquisition result in the first feature amount acquisition part,
   wherein the predetermined determination in each of the divided areas is performed by comparing the first feature amount of each of the divided areas in the inspection target peripheral edge image with a second feature amount of each of divided areas in a reference peripheral edge image, the reference peripheral edge image being an image of a peripheral portion of a reference substrate as a reference of the predetermined determination,
   wherein each of the divided areas has a rectangular shape having an identical width, and
   wherein the first feature amount is an average of pixel values in each of the divided areas having the identical width.

* * * * *